United States Patent [19]

Chang et al.

[11] 4,040,891

[45] Aug. 9, 1977

[54] ETCHING PROCESS UTILIZING THE SAME POSITIVE PHOTORESIST LAYER FOR TWO ETCHING STEPS

[75] Inventors: Kenneth Chang, Hopewell Junction; Marvin S. Pittler, Poughkeepsie, both of N.Y.

[73] Assignee: IBM Corporation, Armonk, N.Y.

[21] Appl. No.: 701,068

[22] Filed: June 30, 1976

[51] Int. Cl.² .................. H01L 21/306; C23F 1/02
[52] U.S. Cl. .................. 156/651; 156/247; 156/344; 156/656; 156/657; 156/659; 156/661; 204/192 S; 427/88; 427/89
[58] Field of Search .................. 29/580, 590, 591; 156/3, 8, 11, 17, 247, 344, 651, 656, 657, 659, 661, 662; 96/36.2, 38.4; 148/187; 427/88-91, 325; 204/129.1, 129.65, 164 S, 192

[56] References Cited

U.S. PATENT DOCUMENTS

| | | | |
|---|---|---|---|
| 3,542,551 | 11/1970 | Rice | 156/17 X |
| 3,649,393 | 3/1972 | Hatzakis | 156/8 X |
| 3,853,576 | 12/1974 | Netznik | 156/344 X |
| 3,858,304 | 1/1975 | Leedy et al. | 96/36.2 |
| 3,878,008 | 4/1975 | Gleason et al. | 156/11 |

*Primary Examiner*—William A. Powell
*Attorney, Agent, or Firm*—J. B. Kraft

[57] ABSTRACT

In integrated circuit fabrication a method is provided involving the utilization of the same positive photoresist layer to form two different masks used in two separate etching steps. A positive photoresist layer is formed on a substrate, and portions of the positive photoresist layer are selectively exposed and developed to form the photoresist mask having a pattern of openings therethrough exposing the underlying substrate. Then, the substrate exposed in these openings is etched to form the pattern of recesses in the substrate corresponding to the openings. Next, portions of the remaining photoresist layer respectively adjacent to openings in the photoresist layer are exposed and developed to laterally expand such openings, after which the substrate exposed in these expanded openings is etched whereby the portions of the recesses underlying the original openings are etched deeper than the portions of the recesses underlying the expanded portions of said openings. The result is a two-level recess pattern.

In accordance with an important aspect of the disclosure, the substrate being etched is a layer of electrically insulative material formed over an integrated semiconductor circuit member, and the deeper portions of the recesses are etched completely through the insulative layer to form holes which may be used for the passage of contacts to a semiconductor substrate where the insulative layer is directly on the substrate or as via holes when the insulative layer is formed between two layers of integrated circuit metallurgy.

11 Claims, 8 Drawing Figures

ETCHING PROCESS UTILIZING THE SAME POSITIVE PHOTORESIST LAYER FOR TWO ETCHING STEPS

CROSS REFERENCE TO RELATED PATENT-APPLICATION

Ser. No. 701,451
Title: An Integrated Fabrication Method of Forming Connectors Through Insulative Layers
Inventor: Kenneth Chang
Filed: June 30, 1976.

BACKGROUND OF THE INVENTION

The present invention relates to a method of photoresist or photolithographic etching utilized in the integrated circuit art. More particularly, it relates to a method of etching using positive photoresist masking which makes it possible to embed metallurgy levels within the body of, i.e., below the surface of an insulative layer to thereby produce integrated circuits with multilevel metallurgy in which deviations from planarity are minimized.

In the construction of thin film integrated semiconductor circuits wherein a plurality of passivating or insulating films or layers are formed between a plurality of raised conductive line patterns, e.g., metallization patterns, the insulative layers follow the contours of the underlying metallization patterns, i.e., the insulative layers will have raised portions or elevations corresponding to those in the underlying metallization patterns. The integrated circuit art has long recognized that in multilayered structures, the cumulative effect of several levels of raised metallization on the final insulative layer could be very pronounced and undesirable. Consequently, the art is constantly seeking ways to minimize such elevations and to approach planarity.

The attempts in the prior art to minimize the cumulative or "skyscraper" effect in the case of multilevel metallurgy have been many and varied. Some approaches toward the solution of this "skyscraper" effect involve resputtering to eliminate the elevations, as described in U.S. Pat. No. 3,868,723, or by selective etching involving a reflowed photoresist material as described in copending application, Ser. No. 480,086, B. Feng, filed June 17, 1974, U.S. Pat. No. 3,976,524.

The method of the present invention provides a simple approach to the problem of achieving planarization in multilevel metallurgy integrated circuit structures.

SUMMARY OF THE INVENTION

Accordingly, it is a primary object of the present invention to provide a method for producing multilevel metallurgy integrated circuit structures having minimal deviations from planarity.

It is another object of the present invention to provide a method for forming integrated circuit structures having multilevels of metallurgy separated by electrically insulative layers wherein at least one level of metallurgy is embedded in an insulative layer to thus minimize deviations in planarity caused by elevations in the metallurgy pattern.

It is yet another object of the present invention to provide a method wherein the same photoresist layer may be used to form two different masks to be used as etch barriers respectively in two separate etching steps.

In accordance with the present invention, in integrated circuit fabrication, a method is provided for etching a substrate such as an insulative layer over an integrated circuit by first forming a photoresist layer on the substrate and then selectively exposing and developing portions of the photoresist layer to form an photoresist mask having a pattern of openings therethrough exposing the underlying substrate, e.g., insulative layer. The substrate in the openings is then etched to form a corresponding pattern of recesses therein, after which the remaining photoresist is again selectively exposed and developed to remove portions of this remaining photoresist mask adjacent to the openings of the mask to laterally expand said openings. Next, the substrate, e.g., insulative layer, exposed in these expanded openings is again etched whereby the portions of the recesses underlying the original openings are etched deeper than the portions of the recesses underlying the expanded portions of said openings. This results in a step pattern in the insulative layer.

In accordance with the preferred aspect of the present invention, the etching is conducted so that the portions of the recesses underlying the original openings are etched through during the second etching step to form holes through the insulative layer which may either be contact holes or via holes between levels of metallurgy. Next, a blanket metal deposition is formed over the structure to deposit metal in the via holes and in the recesses which remain insulated from the lower portion of the integrated circuit by the underlying insulative layer as well as on the remaining photoresist mask. Then, the photoresist mask remaining is removed utilizing "lift-off" techniques to leave the metal in the contact or via holes as well as in the recessed pattern remaining insulated from the underlying structure. As a result, the metal remaining in the recess pattern provides a metallurgy pattern embedded in the insulative layer continuous with the contacts or vias for interconnecting such contacts and vias.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

In illustrating the method of the present invention, the formation of a first level metallurgy in combination with a metallic contact to a semiconductor substrate will be described with respect to FIGS. 1 - 5. Then, the formation of a second level of metallurgy together with a via connector connected to the first level of metallurgy will be described with respect to FIGS. 6 - 8.

Figure 1:
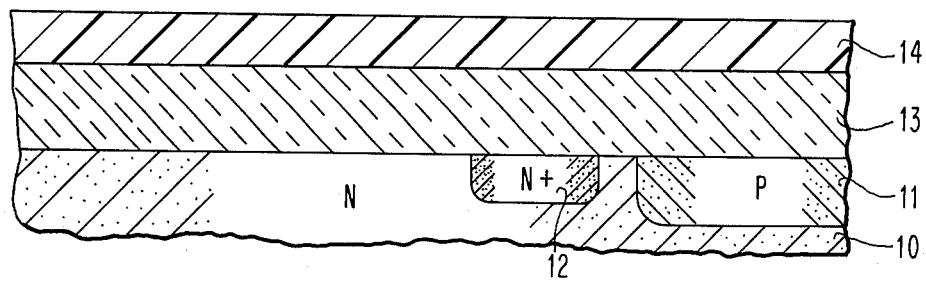
FIGS. 1 - 8 are diagrammatic cross-sectional views of an integrated circuit structure during fabrication in accordance with the preferred embodiments of the present invention.

With reference to FIG. 1, the initial structure comprises an integrated circuit substrate 10 which has P-type regions 11 and N-type regions 12 providing active and passive regions of the integrated circuit. Substrate 10 may be considered to be the conventional integrated circuit structure such as that described in, for example, U.S. Pat. No. 3,539,876. Substrate 10 is covered with a conventional passivation insulative layer 13 which may be made of any of the conventional materials, e.g., silicon dioxide, silicon nitride or a composite of silicon nitride over silicon dioxide. It should be noted, that the structures being described, unless otherwise indicated, are conventional integrated circuit structures which may be fabricated by the methods known in the integrated circuit art, e.g., the methods described in U.S. Pat. No. 3,539,876. For purposes of this present description, layer 13 will be considered to be a layer of silicon dioxide formed on silicon substrate 10 by thermal oxidation; layer 13 has a thickness of 15,000 A. A layer of positive photoresist 14, 23,000 A in thickness, is formed on the surface of silicon dioxide layer 13. This positive photoresist may be any conventional positive photoresist, e.g., of the type described in either of U.S. Pat. Nos. 3,201,239, 3,046,120 or 3,666,473. Alternatively, a conventional photoresist comprising a novolak-type phenolformaldehyde resin and a photosensitive cross-linking agent. The photoresist may be applied by any conventional spinning technique.

Figure 2:
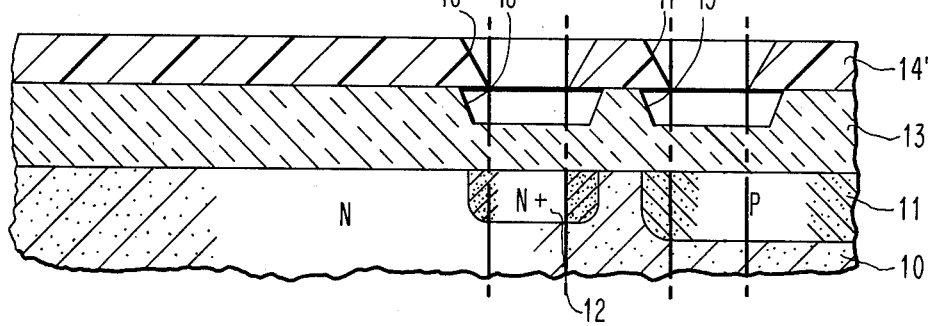

Next, as shown in FIG. 2, utilizing conventional photoresist masking and exposure techniques, a photoresist mask 14' having a pattern of openings such as openings 16 and 17 is formed. Then, with photoresist mask 14' functioning as an etch barrier, recesses 18 and 19 respectively corresponding to openings 16 and 17 are etched into substrate 13. In order to form recesses 18 and 19, any conventional etching technique may be employed such as those described in U.S. Pat. No. 3,539,876. The standard etchant which may be used is buffered HF. Alternatively, instead of chemical etching openings 18 and 19 may be formed in layer 13 by sputter etching, utilizing conventional sputter etching apparatus and methods such as those described in U.S. Pat. No. 3,598,710, particularly sputter etching carried out utilizing reactive gases such as oxygen or hydrogen. U.S. Pat. No. 3,471,396 sets forth a listing of inert or reactive gases or combinations thereof which may be used in sputter etching. An effective RF sputter etching system for etching openings in insulative materials is an RF sputter etching system described in the above-mentioned patent utilizing an oxygen atmosphere. As may be seen, recesses 18 and 19 are etched part way down into the silicon dioxide layer 13. For example, when silicon dioxide 13 has a thickness as previously described in the order of 15,000 A, recesses 18 and 19 are etched down to 11,000 A from the surface of silicon dioxide layer 13.

Then, as shown in FIG. 3, again using the previously described conventional photoresist masking and exposure techniques, the remaining portions of photoresist mask 14', which remain photosensitive since the resist is a positive resist, are exposed so that the dimensions of original openings 16 and 17 are laterally expanded to openings 16A and 17A thus providing a new photoresist mask 14" having openings with expanded lateral dimensions. Next, utilizing any of the previously described etching techniques with mask 14" as an etch barrier etching of the silicon dioxide layer 13 is continued to provide openings 18A and 19A through insulative layer 13 under the areas of the original recesses 18 and 19 as defined by mask 14' in step 2 and expanded recessed portions 20 and 21 under the laterally expanded portions of openings 16A and 17A in photoresist mask 14', FIG. 3. The thickness of the silicon dioxide layer under recesses 20 and 21 is in the order of 1,000 A. In order to better illustrate the extent of the lateral expansion in openings 16A and 17A, phantom lines have been drawn in FIGS. 2 and 3 to indicate the lateral dimensions of original openings 16 and 17 in photoresist mask 14'.

Figure 3:
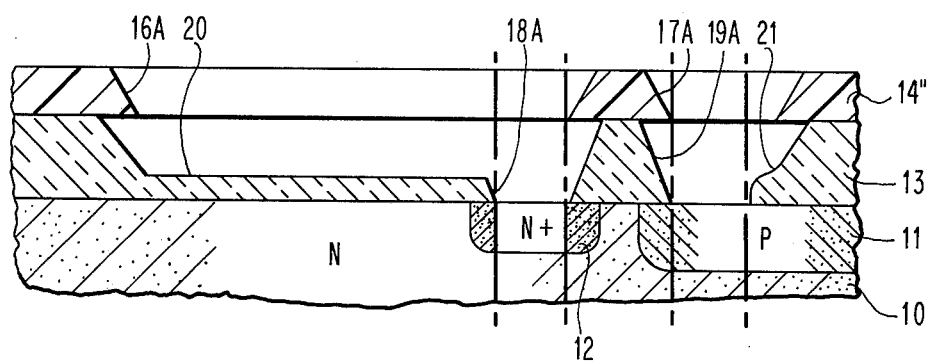
Figure 4:
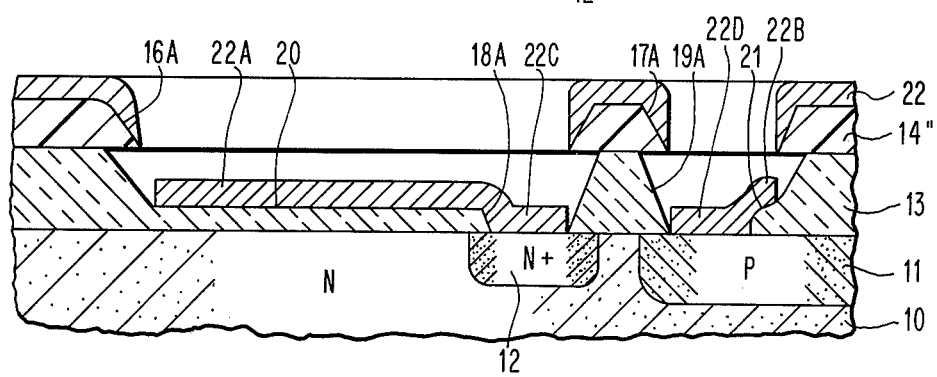

Upon the completion of the steps in FIG. 3, it is preferable that the structure be heated at a temperature in the order of 150° C for about 1 hour in order to toughen photoresist mask 14" for the subsequent metal deposition step shown in FIG. 4. Next, FIG. 4. Next, FIG. 4, a layer of metal 22 about 0.9 – 1.0 microns in thickness is deposited over the structure using conventional metal deposition techniques as described above with substrate temperatures of about 100° C. The metal used for this metallization layer 22 may be any conventional metal used in integrated circuit connections. In the present embodiment, it is preferably an aluminum alloy containing some copper and some silicon. However, any conventional integrated circuit metallurgy including chromium, copper or alloys thereof may be used. The metallic layer may be deposited by any of the conventional techniques such as those described in U.S. Pat. No. 3,539,876. The deposition may be, for example, vapor deposition or RF sputter deposition. In addition to the metal deposited on the surface of photoresist mask 14", portions of the metal 22A and 22B will be respectively deposited in recesses 20 and 21 and portions of the metal layer 22C and 22D will be respectively deposited in openings 18A and 19A to form contacts respectively with regions 12 and 11.

Figure 5:
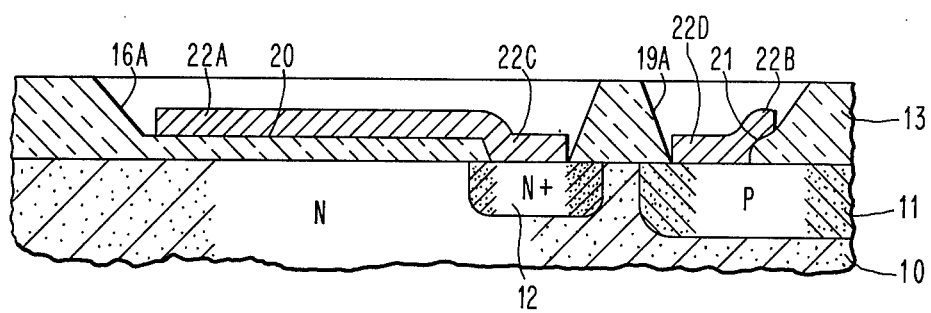

Next, following conventional "lift-off" techniques, photoresist mask 14" is removed, the "lift-off" carrying with it all portions of metal layer 22 except those portions 22A, 22B, 22C and 22D deposited in the recesses and openings to produce the structure shown in FIG. 5. In this connection, it should be noted that "lift-off" techniques are well-known in the art. U.S. Pat. No. 3,873,361 gives a good state of the art picture of "lift-off" techniques. In accordance with such conventional "lift-off" techniques, layers 14" and 22 may be removed by immersing the structure of FIG. 4 in a conventional photoresist solvent. Conventional photoresist solvents which may be used in such "lift-off" techniques are set forth in U.S. Pat. No. 3,873,361 commencing at column 5, line 45. However, for best results, it is preferable that the "lift-off" be carried out by pressing a contact adhesive tape such as Scotch Tape* against metal layer 22 and peeling off layer 22 together with some of the photoresist following by the removal of any remaining portions of photoresist mask 14" by standard photoresist removal solvents and techniques.

*Trademark of 3M Corporation

Thus, with respect to the structure of FIG. 5, contacts such as contact 22C with semiconductor region 12 extend through insulative layer 13 conductively connected to a metallization pattern such as 22A which provides the first level metallization pattern and is defined by the recesses 20 which in turn are defined by the expanded lateral openings 16A in FIGS. 3 and 4. Metallic portions 22D likewise provide contacts and are coextensive with metallization portions 22B which, for example, are often necessary so that the current-carrying line to the contact have a sufficiently great conductivity and yet are not necessary for the direct ohmic contact with the semiconductor substrate. Thus, portions 22B may be appropriately formed in recesses 21 to be electrically insulated from the semiconductor substrate.

Figure 6:
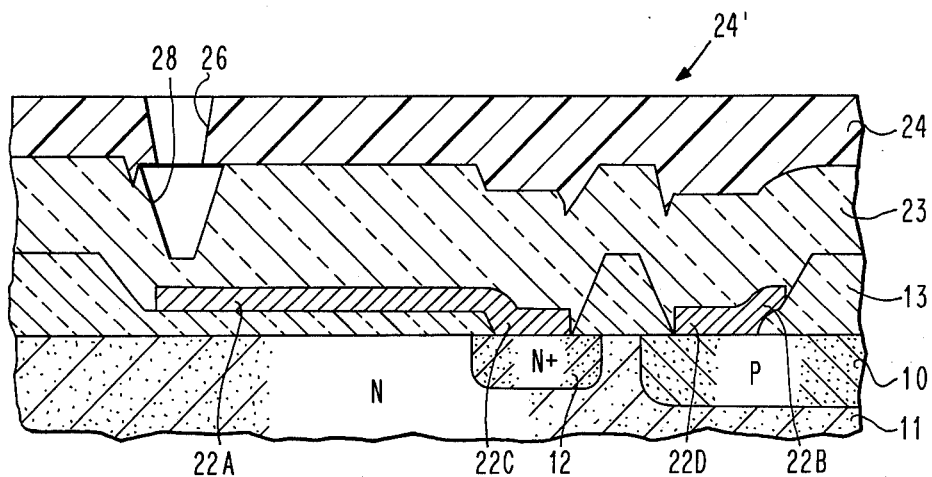

With respect to FIGS. 6 – 8, the method for forming the second level of metallurgy together with the via connectors through a separating insulative layer to the first level of metallurgy will now be described. A layer of electrically insulative material 23 about 37,000 A in thickness is deposited over the completed structure of FIG. 5. This layer may be formed by any of the conventional deposition techniques such as that described in U.S. Pat. No. 3,539,876, for example, by the chemical vapor deposition methods described therein as well as the cathode sputtering or RF sputtering methods described. While this layer may be of such conventional materials as silicon nitride, aluminum oxide or silicon dioxide as well as composites thereof, for the present invention we will consider the layer to be a layer of silicon dioxide. The photoresist mask 24' is then formed from a photoresist layer 24 under the conditions and of the proportions previously described with respect to photoresist mask 14' except that mask 24' has a pattern of openings 26 corresponding to the positions at which via holes are to be formed through insulative layer 23 to underlying first level metallization pattern 22A. Next, utilizing the conventional etching techniques previously described for forming recesses in insulative layer 13, recesses such as recess 28 are formed in insulative layer 23 at the positions where the via holes are to be subsequently formed. In the case where silicon dioxide layer 23 has a thickness of 37,000 A, recesses 28 conveniently extend to a depth of 26,000 A from the surface of silicon dioxide layer 23.

Figure 7:
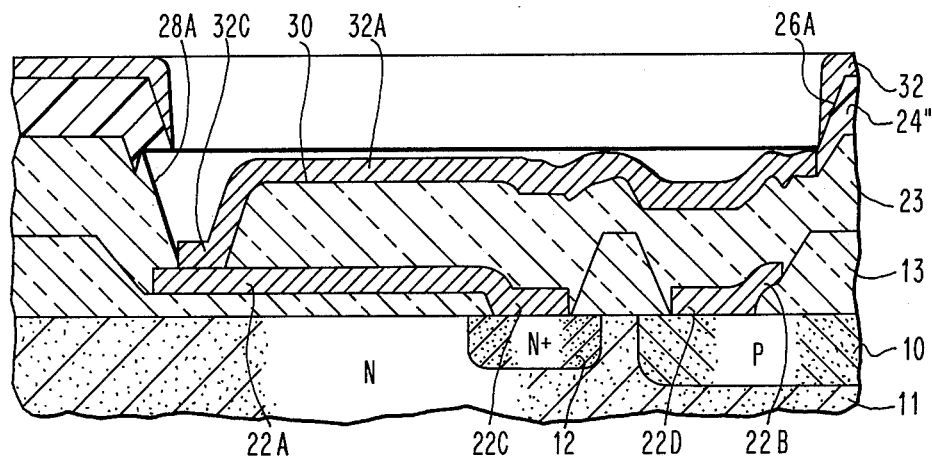

Then, following procedures similar to those previously described with respect to FIGS. 3 and 4, the structure of FIG. 7 is formed. First, the remaining photoresist layer is reexposed and developed to expand the lateral dimensions of openings 26 (FIG. 6) to form a photoresist mask 24" having laterally expanded openings 26A (FIG. 7). Mask 24" is formed in the same manner as photoresist mask 14".

Then following the procedures previously described with respect to etching through the silicon dioxide layer to form openings 18A and recesses 20 in FIG. 3, openings 28A (FIG. 7) are etched to provide the via holes through silicon dioxide layer 23 are formed as well as recesses 30. Recesses 30 are formed in a pattern corresponding to the pattern desired for the second level of metallurgy in the integrated circuit. At this point, following the methods previously described with respect to the deposition of metallization layer 22 in FIG. 4, a layer of metallization 32 preferably of the same composition as layer 22 and about 1.2 - 1.3 microns thick is blanket deposited. Those portions 32A of the layer which are deposited in recesses 30 provide the second level metallization pattern in the integrated circuit while those portions 32C deposited in via holes 28A provide the via contacts connecting the second level metallization pattern 32A to the first level metallization pattern 22A.

Figure 8:
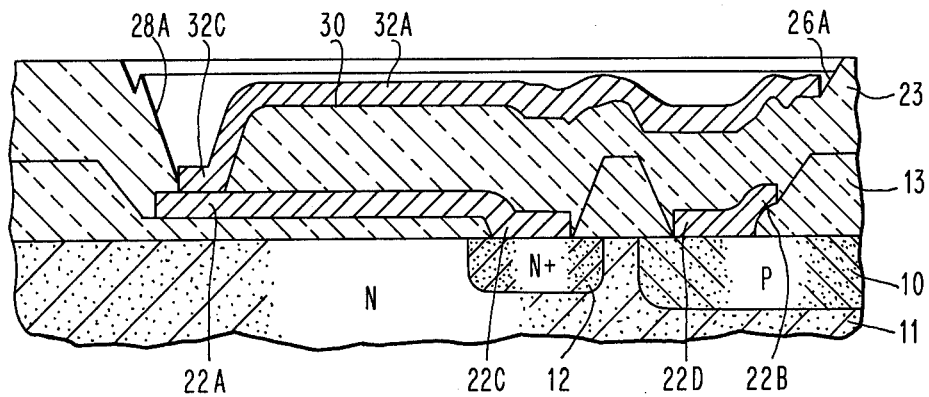

The structure of FIG. 7 is then subjected to the previously described "lift-off" steps to remove remaining photoresist mask 24" together with the overlying layer of metallization 32 to produce the structure of FIG. 8. Thus, it may be seen with respect to the structure of FIG. 8 that since the first level metallization pattern 22A is embedded beneath the surface of the first insulative layer 13 and the second level metallization pattern 32A is embedded beneath the surface of the second insulative layer 23 that a multilevel integrated circuit structure approaching planarity may be formed thereby avoiding the previously described undesirable "skyscraper" effect.

It will, of course, be understood that should third and even subsequent levels of metallization be desired they may be formed in a manner similar to that previously described herein. Upon the completion of the multilevels of metallurgy, the integrated circuit may be further insulated and have contact pads formed thereto following the conventional prior art procedures such as that described in U.S. Pat. No. 3,539,876.

While the method of the present invention involving the formation of a plurality of photoresist masks from a single positive photoresist has been described for purposes of illustration with only two different masks formed from the same positive photoresist layer, it will be understood that even more than two masks may be formed so long as each succeeding mask has openings having greater lateral dimensions than the preceding masks.

Also, while this double photoresist mask formation method has been described with respect to forming openings and first level metallurgy through insulative layers, it may also be used in other integrated circuit fabrication methods where double etching steps in the areas abutting each other are desired. For example, when forming openings through relatively thick insulative layers in the order of 2 microns or greater in integrated circuits, the slopes of the openings are often too steep and produce discontinuities between the metal deposited in the openings and that deposited over the surface of an insulative layer. This problem is described in greater detail in copending application entitled, "An Integrated Fabrication Method of Forming Connectors Through Insulative Layers," K. Chang, filed on the same date as the present application. The method of the present invention provides a potential solution to this problem by a double etching technique like that described herein wherein the second etching step in the areas of the openings having the expanded lateral dimensions of the mask etches only part way down into the insulative layer thus forming a more gradual slope along the edges of any opening defined by the photoresist mask with the expanded lateral dimensions.

While the invention has been particularly shown and described with reference to the preferred embodiments thereof, it will be understood by those skilled in the art that various changes in form and details may be made therein without departing from the spirit and scope of the invention.

What is claimed is:

1. In integrated circuit fabrication, a method for etching a substrate comprising
   forming a positive photoresist layer on a substrate,
   selectively exposing and developing portions of the photoresist layer to form a photoresist mask having a pattern of openings therethrough exposing the underlying substrate,
   etching the substrate exposed in said openings to form a corresponding pattern of recesses in said substrate,
   selectively exposing and developing portions of the remaining photoresist layer respectively adjacent to said openings to laterally expand said openings, and
   etching said substrate exposed in said expanded openings whereby the portions of recesses underlying the original openings are etched deeper than the portions of the recesses underlying the expanded portions of said openings.

2. The method of claim 1 wherein said substrate is a layer of electrically insulative material formed over an integrated semiconductor circuit member.

3. The method of claim 2 wherein said portions of the recesses underlying the original openings are etched through said insulative layer to form holes.

4. The method of claim 3 including the further steps, subsequent to the etching through said expanded openings, of
  depositing a layer of metal over the photoresist masked insulative layer and in said exposed recesses and holes,
  removing the remaining photoresist mask to thereby remove the metal layer deposited on said photoresist with only the metal deposited in said recesses and holes remaining.

5. The method of claim 4 wherein said integrated semiconductor circuit member comprises
  regions of different conductivity types, a plurality of which regions are exposed in said holes, whereby the metal remaining in said holes provides contacts to said exposed regions while the metal remaining in said insulative layer recesses provides a metallurgy pattern interconnecting said contacts.

6. The method of claim 4 wherein said integrated semiconductor circuit member over which said insulative layer is formed comprises a lower metallurgy pattern on a lower layer of electrically insulative material, and a plurality of areas in said lower metallurgy pattern are exposed in said holes whereby the metal remaining in said holes provides vias to said lower metallurgy pattern while the metal remaining in said insulative layer provides an upper metallurgy pattern interconnecting said vias.

7. The method of claim 4 wherein at least one of said etching steps is carried out by chemical etching.

8. The method of claim 4 wherein at least one of said etching steps is carried out by RF sputter etching.

9. The method of claim 8 wherein said RF sputter etching utilizes reactive ions.

10. The method of claim 4 wherein said photoresist mask is removed by the steps of
  applying a sheet having a contact adhesive surface to said layer of metal, and
  removing said sheet to selectively remove those portions of said second metal layer over said photoresist together with said photoresist.

11. The method of claim 10 wherein said sheet is adhesive-coated tape.

* * * * *